United States Patent [19]

Wright

[11] Patent Number: 4,865,943
[45] Date of Patent: Sep. 12, 1989

[54] METHOD FOR FORMING IMAGES USING FREE FLOWING PHOTOSENSITIVE MICROCAPSULES

[75] Inventor: Richard F. Wright, Chillicothe, Ohio
[73] Assignee: The Mead Corporation, Dayton, Ohio
[21] Appl. No.: 770,538
[22] Filed: Aug. 28, 1985
[51] Int. Cl.⁴ .................... G03C 1/40; G03C 1/00
[52] U.S. Cl. .................................................. 430/138
[58] Field of Search ......................................... 430/138

[56] References Cited

U.S. PATENT DOCUMENTS

| | | | |
|---|---|---|---|
| 3,016,308 | 6/1962 | MacAulay | 430/138 |
| 3,080,251 | 3/1958 | Claus | 430/120 |
| 3,318,697 | 5/1967 | Shrewibury | 430/138 |
| 3,516,941 | 6/1970 | Matson | 430/138 |
| 4,000,089 | 12/1976 | Maalouf | 430/138 |
| 4,375,492 | 3/1983 | Fox | 428/212 |
| 4,399,209 | 8/1983 | Sanders et al. | 430/138 |
| 4,440,846 | 4/1984 | Sanders et al. | 430/138 |

Primary Examiner—Paul R. Michl
Assistant Examiner—Patrick A. Doody
Attorney, Agent, or Firm—Smith & Schnacke

[57] ABSTRACT

A method for forming images in which photosensitive microcapsules having an image-forming agent associated therewith are coated on a support as a free-flowing powder; the layer of microcapsules thus formed is image-wise exposed to actinic radiation and subjected to a uniform rupturing force to produce an image; the image may be formed directly on the support upon which the microcapsules are coated or the support may contact an image-receiving sheet to which the image is imparted.

20 Claims, 8 Drawing Sheets

METHOD FOR FORMING IMAGES USING FREE FLOWING PHOTOSENSITIVE MICROCAPSULES

BACKGROUND OF THE INVENTION

The present invention relates to a method for forming images using photosensitive microcapsules and, more particularly, it relates to a method in which microcapsules containing a photosensitive internal phase are deposited, as a free flowing powder, onto a support where they are image-wise exposed and ruptured. The method of the present invention obviates the need for an imaging sheet and, in accordance with certain embodiments, provides for plain paper copying.

U.S. Pat. Nos. 4,399,209 and 4,440,846 to The Mead Corporation describe transfer and self-contained imaging systems in which an imaging sheet comprising a support carrying a layer of photosensitive microcapsules and an associated color-forming agent is image-wise exposed to actinic radiation and subjected to a uniform rupturing force, such as pressure, in the presence of a developer material. The microcapsules rupture and image-wise release the internal phase, and the color-forming agent thereupon image-wise reacts with the developer material and produces an image. U.S. Pat. No. 4,399,209 describes a transfer system in which the photosensitive microcapsules and the developer material are provided on separate supports which must be combined in the imaging apparatus to form the image. U.S. Pat. No. 4,440,846 describes a self-contained imaging sheet in which the photosensitive microcapsules and developer are carried on the surface of a single sheet.

The present invention relates to a method for forming images which obviates the need for the pre-coated imaging sheets described in the aforementioned patents. The present invention is characterized in that photosensitive microcapsules are uniformly coated on a support as a free-flowing powder in the imaging apparatus.

SUMMARY OF THE INVENTION

In accordance with the present invention, photosensitive microcapsules having discrete capsule walls and containing a photosensitive composition in the internal phase are uniformly deposited on a support as a free-flowing powder. The microcapsules are maintained on the support in their uniformly deposited state while they are image-wise exposed to actinic radiation and subsequently subjected to a uniform rupturing force. Upon rupturing the microcapsules, the internal phase is image-wise released and images are formed. Images can be formed directly on the support onto which the microcapsules have been deposited, or the support can function as an exposure and carrier means and be used to place the exposed layer of the microcapsules in contact with an image-receiving sheet upon which the image is ultimately formed. In one embodiment of the present invention, images are formed on plain paper.

Typically, the internal phase of the microcapsules contains both a photosensitive composition and an image-forming agent, however, the image-forming agent can be incorporated in the microcapsule walls or be otherwise associated with the microcapsules such that exposure of the microcapsules controls the activation or mobilization of the image-forming agent. The image-forming agent may be a colored agent such as a colored dye or pigment, or the image-forming agent may be one half of a chromogenic pair such as a substantially colorless electron donating color former or an electron accepting color developer.

In one embodiment of the invention, images are formed on plain paper by uniformly coating the surface of the paper with photosensitive microcapsules containing a dye or pigment, image-wise exposing the microcapsules to actinic radiation, and subjecting the microcapsules to a uniform rupturing force. The microcapsules image-wise release the dye or pigment to the surface of the paper and an image is thereby formed.

Where the microcapsules contain one half of a chromogenic pair, to copy on plain paper both the microcapsules and the other half of the chromogenic pair must be introduced to the surface of the paper upon development. In a preferred embodiment of the present invention, the photosensitive microcapsules contain a substantially colorless electron donating color former and images are formed on plain paper by depositing a mixture of the photosensitive microcapsules and an electron accepting developer material on the surface of the paper prior to exposure and development.

In accordance with the present invention images can also be formed on the surface of a developer sheet, i.e., a sheet of paper pre-treated with a developer material. Here, a uniform layer of photosensitive microcapsules containing a color former is deposited on the surface of a developer sheet, the sheet is image-wise exposed to actinic radiation and the microcapsules are ruptured as described above. The microcapsules image-wise release the color former which migrates to the developer sheet where the image is formed.

In another embodiment of the present invention, the microcapsule walls are formed from a material having surface triboelectric properties suitable for electrostatic deposition. The microcapsules are deposited on the surface of a uniformly electrostatically charged support where the microcapsules are image-wise exposed to actinic radiation. As the microcapsules are subjected to a uniform rupturing force, the support is brought into contact with an image-receiving sheet such as plain paper or a developer sheet where images are formed.

In summary, the present invention resides in a method for forming images which comprises:

depositing a uniform layer of photosensitive microcapsules on the surface of a support, said microcapsules comprising a discrete capsule wall containing a photosensitive composition, being in the form of a free flowing powder, and having an image-forming agent associated therewith, image-wise exposing said layer of photosensitive microcapsules to actinic radiation, subjecting said layer of photosensitive microcapsules to a uniform rupturing force such that said microcapsules image-wise rupture and release said internal phase, and removing the microcapsules from the support.

A more preferred embodiment of the present invention is a method for forming images of the aforementioned type in which the microcapsules contain a substantially colorless color-former and the microcapsules are subjected to a uniform rupturing force in the presence of a developer material such that when the microcapsules rupture and image-wise release the internal phase, the color-former reacts with the developer and produces a visible image.

In accordance with still another embodiment of the present invention, polychromatic and, more particularly, full color images are formed.

DEFINITIONS

The term "plain paper" as used herein refers to writing paper, bond and the like, and does not exclude a paper which has been treated or prepared in a manner which enhances the quality of the images produced in accordance with the present invention.

The term "actinic radiation" includes the entire spectrum of electromagnetic radiation as well as x-ray and electron or ion beam radiation. The preferred forms of actinic radiation are ultraviolet radiation and visible light having a wavelength of 190 to 800 nm and most preferably 350 to 480 mm.

DETAILED DESCRIPTION OF THE INVENTION

Figure 1:
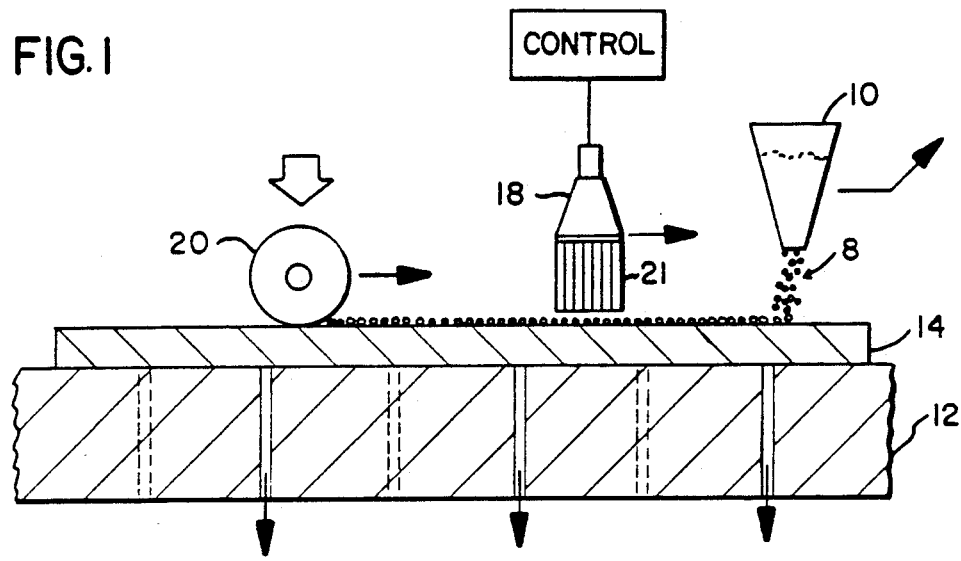
FIGS. 1-3 are schematic illustrations of the imaging process of the present invention.

FIG. 1 illustrates one example of an imaging process in accordance with the present invention. Therein, the photosensitive microcapsules 8 are shown as being supplied from a hopper or similar dispensing means 10 which si positioned above a support 12 over which the sheet to be imaged (the image-receiving sheet) 14 passes. As the image-receiving sheet 14 moves into position on support 12, or after the sheet is in position, the microcapsules are deposited onto the surface of the sheet by the dispenser 10. The dispenser 10 is designed and controlled such that a uniform coating of photosensitive microcapsules of a sufficient thickness and density to form good quality images is provided to the surface of the image-receiving sheet 14. The dispenser may be vibrated to assist in uniformly distributing the capsules. The dispenser 10 can take various forms. A gravity fed hopper is illustrated, but other means conventionally use in powder coating could be adopted for use herein.

The support 12 should be equipped with means to hold the image-receiving sheet 14 in place without movement during imaging. The support may also be equipped with means to assist in uniformly distributing the microcapsules across the surface of the image-receiving sheet. In FIG. 1, support 12 is shown as having vacuum ports 16 for holding the sheet on the surface of the support.

In FIG. 1, the dispensing means 10 is shown as being movably mounted such that it can travel the length of the support 12, deposit the microcapsules onto the surface of the sheet 14, and then move to a remote position at which it does not interfere with the subsequent exposure and development steps. Alternatively, the dispensing means 10 can be mounted in a fixed position and deposit microcapsules onto the surface of the image-receiving sheet 14 as the sheet moves past the dispenser 10 and into position on the support 12.

The microcapsule coated sheet 14 can be exposed image-wise using conventional imaging techniques such as direct transmission imaging and reflection imaging. Direct transmission imaging can be carried out using a cathode ray tube (CRT), an LCD exposure apparatus, or a light valve imaging apparatus of the type described in U.S. Pat. No. 4,367,946 to Varner. FIG. 1 illustrates an embodiment in which a cathode ray tube 18 is movably positioned above the support 12. The cathode ray tube 18 is electronically controlled via control circuit 19 such that the travel and energization of the CRT are synchronized such that each incremental line of the image-receiving sheet 14 is exposed in accordance with imaging information that is carried to the imaging apparatus, for example, in the form of an electro-video signal. FIG. 1 is a schematic illustration. Depending upon the distance between the CRT and the image-receiving sheet and the image sharpness that is desired, it may be desirable to optically couple the CRT to the image-receiving sheet using an array of optical fibers 21 or the like. As in the case of the dispenser 10, an imaging apparatus can also be designed such that the image-receiving sheet 14 carrying the microcapsules is exposed as it passes in front of a stationary exposure apparatus. The important requirement here is that the position of the microcapsules not change until the image is formed.

Following exposure, the layer of microcapsules applied to the image-receiving sheet 14 is subjected to a uniform rupturing force. In FIG. 1, this function is shown as being accomplished by means of pressure roller 20 which is positively biased against the surface of support 12. As the roller 20 engages sheet 14 and travels the length of the support 12, it compresses the microcapsules between the roller and the support and causes them to rupture and image-wise release the internal phase. Again, the roller can be stationary and the sheet can be transported thereunder. Means other than pressure (such as heat and ultrasonic vibration) can also be used to rupture the microcapsules and may, in fact, be more desirable than pressure from the standpoint of not disturbing the position of the microcapsules during the development step.

Where the image-forming agent associated with the microcapsules is a colored dye or pigment, images are formed directly upon the image-receiving sheet (plain paper) by depositing, exposing and rupturing the microcapsules as explained above. It is, however, difficult to design photosensitive microcapsules containing colored image-forming agents because colored image-forming agents tend to absorb incident radiation and thus interfere with exposure of the microcapsules. Therefore, in the preferred embodiments of the present invention, the image-forming agent associated with the microcapsules is a substantially colorless compound such as the color formers conventionally used in the carbonless paper art.

In accordance with the present invention, images can be formed on plain paper using color formers and developers by rupturing the photosensitive microcapsules associated with the color former and reacting the color former with the color developer on the paper surface. This can be accomplished using various techniques. For example, photosensitive microcapsules containing a color former can be mixed with a color developer in the dispensing means 10. In this case, the color developer can be present in powder form in admixture with the capsules or the developer can be encapsulated in separate microcapsules so as to minimize any tendency for the color developer to react with the color former prior to imaging. Most microcapsule preparations contain small amounts of unencapsulated color former, i.e., color former that is not encapsulated as a result of the encapsulation process. This color former can react with the developer if the two are mixed prior to imaging unless the developer is separately encapsulated. The color developer microcapsules can be photosensitive or non-photosensitive.

As a further alternative, the photosensitive microcapsules and the developer material can be applied to the image-receiving sheet separately, i.e., from separate dispensing means simultaneously or at different times.

In one embodiment of the invention, encapsulated or non-encapsulated color developer can be applied to the surface of an image-receiving sheet and then a second coating of photosensitive microcapsules containing the color former can be applied. Since it is not necessary for the developer to be present until after exposure, the photosensitive microcapsules can be applied to the image-receiving sheet first, the sheet can be exposed, and then the developer composition can be applied after image-wise exposure. In this embodiment, the developer can be applied and prior to or after subjecting the microcapsules to the rupturing force. Where the developer is applied after rupturing, it can be powder coated on the surface of the imaging sheet, or the imaging sheet can be conveyed through a trough containing the developer material.

To assist in adhering the microcapsules to the surface of the image-receiving sheet, it is envisioned that certain dielectric papers can be used in combination with microcapsules having triboelectric properties as discussed below. In this case the surface of the dielectric paper can be uniformly charged and oppositely charged microcapsules can be electrostatically coated on its face.

Of course, it is not essential to use plain paper in the present invention. A developer sheet can be used as the image-receiving sheet. In this embodiment of the present invention, a developer sheet is fed to the exposure apparatus as the image-receiving sheet 14 shown in FIG. 1 and the developer sheet is coated with microcapsules, image-wise exposed, and subjected to development as described above.

Following exposure and capsule rupture, the microcapsules are removed from the support upon which they are deposited. The microcapsules can be removed by wiping, brushing, and/or using vacuum means. Where the support is an electrostatically charged surface, this can be accomplished by discharging the surface.

Herein, while the invention has been described with reference to embodiments in which the color former is contained in or otherwise associated with the microcapsules and the developer is separately applied, it will be understood that the color developer could be associated with the microcapsules and the color former could be separately applied.

In accordance with other embodiments of the present invention, the microcapsules are not applied directly to the surface of the image-receiving sheet. Rather, they are applied to a processing surface upon which they are exposed and subsequently brought into contact with the image-receiving sheet upon development.

Figure 2:
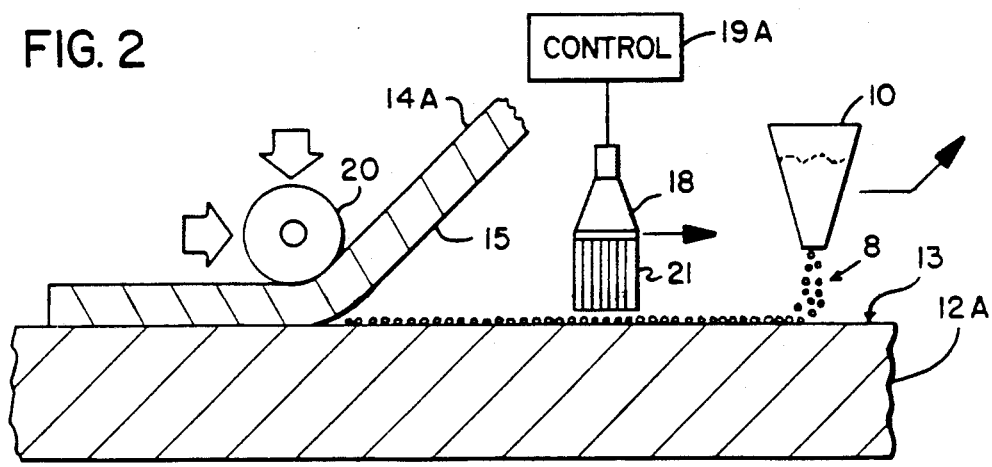

FIG. 2 illustrates a modification of the imaging apparatus of FIG. 1 wherein the microcapsules 8 are coated directly on the surface of the support 12A. The surface 13 of support 12A may be designed or equipped with features which facilitate the formation and maintenance of a uniform microcapsule layer during exposure and development. For example, the surface of support 12A can be formed from a microporous material (not shown) through which a vacuum can be applied to draw the microcapsules to the surface and effect their adherence.

Alternatively, certain electrostatic techniques can be used in accordance with the present invention. The support 12A can be formed from a material which can be uniformly electrostatically charged and used in combination with microcapsules having triboelectric surface properties. Such microcapsules can be formed by coating microcapsules with polystyrene as described in U.S. Pat. No. 3,080,251, which is incorporated herein by reference. By cascading triboelectric microcapsules across the uniformly charged surface, a uniform layer of microcapsules electrostatically adheres to the surface.

Using the imaging apparatus of FIG. 2, the electrostatically coated microcapsules 8 are image-wise exposed as discussed above. Thereafter, the image-receiving sheet 14A can be fed into contact with the support 12A under the pressure roller 20 whereupon the microcapsules are simultaneously subjected to the uniform rupturing force. In this case, the images formed on the lower surface 15 of the imaging sheet 14A are reversed from those formed as shown in FIG. 1 and, consequently, control circuit 19A must be designed to process the imaging information fed to the imaging apparatus such that a true reading image is obtained. Where the image is not generated electronically, as in reflectographic imaging, an appropriate lens system is used in place of the control circuit 19A and CRT 18.

Figure 3:
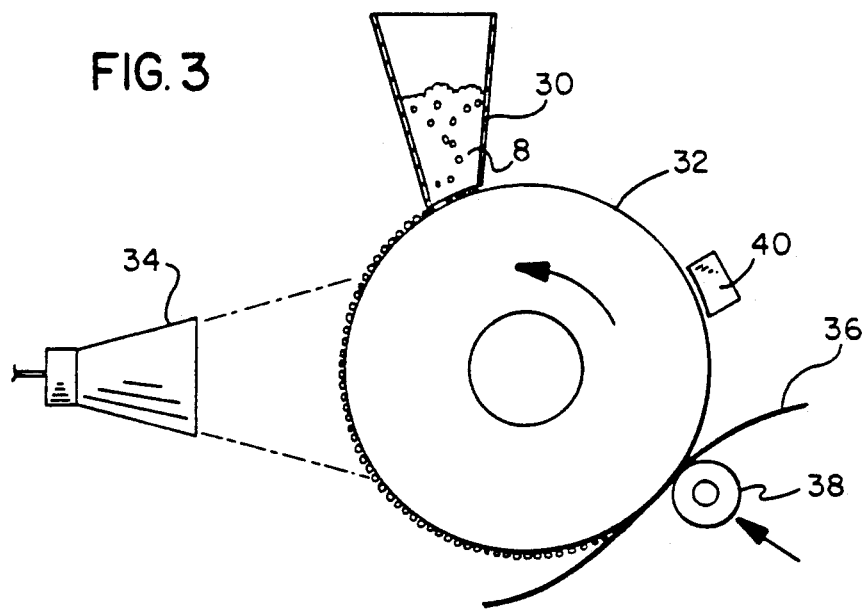

FIG. 3 illustrates a further embodiment of the invention wherein microcapsules are carried on a temporary imaging surface which is brought into contact with an image-receiving sheet for imaging. In FIG. 3 microcapsules 8 dispensed from a hopper 30 are cascade coated onto the surface of a drum 32 which has been uniformly charged. On the drum 32, the microcapsules are rotated in front of an exposure means 34 where the microcapsules are image-wise exposed to actinic radiation. The exposure means can be controlled and coordinated with the rotation of the drum to produce a sequence of line images, or an appropriate lens system can be designed to expose the curved surface of the drum reflectographically. Following exposure, upon continued rotation of the drum 32, the microcapsules 8 are brought into contact with the surface of an image-receiving sheet 36 which is fed into contact with the drum 32 under roller 38. Pressure roller 38 is positively biased against the surface of the drum. The pressure of roller 38 against drum 32 causes the microcapsules to rupture and image-wise release the internal phase. The image produced on image-receiving sheet 36 is reversed from the latent image produced on the drum. After exposure, the ruptured and unruptured microcapsules are removed from the drum by cleaner means 40.

With respect to the application of microcapsules using electrostatic coating techniques, a selenium coated metal drum or plate may be used. While these plates are widely used in xerographic copying techniques because the electrostatic charge produced thereon is discharged upon exposure to high intensity light, this property is not necessary in the present invention. Accordingly, other surface materials which are capable of being electrostatically charged and which do not discharge upon exposure to high intensity light can be used in the present invention.

Polychromatic or full color images can be formed in the present invention by applying a mixture of photosensitive microcapsules individually containing cyan, magenta and yellow color formers and having distinct sensitivities to the surface of the image-receiving sheet or exposure support. Three exposures, corresponding to the red, green and blue components of the images to be reproduced are conducted and the microcapsules are ruptured in the presence of a developer material. Image-wise release of the cyan, magenta and yellow color yields a full color image. Full color imaging using photosensitive microcapsules is described in more detail in U.S. Application Ser. No. 339,917 filed Jan. 18, 1982 and U.S. application Ser. No. 620,994 filed June 15, 1984, both of which are incorporated herein by reference.

The photosensitive microcapsules used in the present invention can be prepared by following the teachings in U.S. Pat. Nos. 4,399,209 and 4,440,846. The teachings in those patents are incorporated herein by reference. Free-flowing microcapsules are obtained by using spray drying, thin film evaporation, and other techniques conventionally used in the manufacture of microcapsules for carbonless papers.

Photosensitive compositions which are useful in the present invention include compositions which are curable by free radical initiated, addition polymerization or crosslinking. The most common examples of such compositions are compositions which contain an ethylenically unsaturated compound, e.g., a compound containing one or more terminal or pendant vinyl or allylic groups. Such compounds are well known in the art and include acrylic and methacrylic esters of polyhydric alcohols such as trimethylolpropane, pentaerythritol, and the like. Representative examples include ethylene glycol diacrylate, ethylene glycol dimethacrylate, trimethylopropane triacrylate (TMPTA), trimethylolpropane trimethacrylate (TMPTMA), pentaerythritol tetraacrylate, pentaerythritol tetramethacrylate, hexanediol-1,6-dimethacrylate, diethyleneglycol dimethacrylate, and dipentaerythritol hydroxypentaacrylate. Commercially available photopolymers such as acrylate and methacrylate terminated polyesters and polyethers are also useful in the present invention.

Certain photosoftenable compositions such as compositions which undergo a decrease in molecular weight or viscosity upon exposure (photolysis) are also useful in the present invention to provide a negative-working process.

The radiation sensitive compositions used in the present invention usually include a photoinitiator. The photoinitiator may be used alone or in combination with a sensitizer. An absorber may also be used in combination with the initiator to adjust the sensitivity of the photosensitive composition. Photoinitiators which generate free radicals upon photochemical cleavage (homolytic initiators) such as certain benzoin ethers are preferred to initiators which function via hydrogen abstraction. Preferred initiators are soluble in the radiation sensitive composition. Diaryl ketone derivatives and benzoin alkyl ethers are particularly useful. Specific examples of useful initiators include benzophenone, Michler's ketone, benzoin methyl ether, and 2,2'-dimethocy-2-phenyl-acetophenone, isopropylxanthone, isopropylthioxanthone, and ethyl para-dimethylaminobenzoate, etc.

The photoinitiator is present in the photosensitive composition in an amount effective to initiate polymerization or crosslinking. For example, isopropylthioxanthone is typically present in an amount up to about 10% by weight based on the weight of the photocrosslinkable or photopolymerizable material present in the photosensitive composition. The exact amount of photoinitiator used will vary with the nature of the photosensitive composition. It is also possible to reduce the exposure time by incorporating a scattering agent such as magnesium oxide in the capsule layer. The scattering agent increases the mean free path and thereby intensifies exposure.

Ultraviolet sensitive microcapsules are generally preferred because they can be handled in room light for short periods of time. They are also useful for copying from a CRT screen. One disadvantage of ultraviolet sensitive systems, however, is that many printed documents are on a paper which includes optical brighteners which absorb ultraviolet radiation. Accordingly, to copy printed documents, blue light sensitive systems are advantageous. These systems can be made room light handleable by incorporating conventional screening agents into the microcapsules.

In accordance with certain embodiments of the present invention (particularly those embodiments in which the photosensitive composition contains a photopolymerizable monomer such as TMPTA) the photosensitive composition may include an oligomeric and/or a polymeric material to further increase the film speed of the microcapsules. Typically, these materials range from about 800 to 3,000 in average molecular weight in the case of oligomers and up to 40,000 in molecular weight in the case of polymers. The oligomer or polymer may be reactive, i.e., curable or polymerizable by free radical initiated polymerization, or not reactive. In both cases, it enhances the film speed by increasing the rate with which the viscosity of the composition reaches a level at which the microcapsules can be differentially ruptured.

Representative examples of some commercially available oligomers which are useful in the present invention include Ebecryl 240, Ebecryl 270, Ebecryl 810 (Virginia Chemicals Inc.); DER 662, DER 663U, DER 664U (Dow Chemical Co.); Cargill 1570 (Cargill); Uvithane 893 (Morton Thiokol Inc.); Diallyl-o-phthalate prepolymer (Polysciences); polyvinylpyrrolidone (GAF).

In some cases it is advantageous to include a polythiol in the photosensitive composition to improve sensitivity (film speed). Useful polythiols contain 2 or more terminal or pendant —SH groups. Examples of polythiols that are desirable for use in the present invention are esters of thioglycolic acid and $\beta$-mercaptopropionic acid. Representative examples of the preferred polythiols include ethylene glycol bis (thioglycolate), ethylene glycol bis ($\beta$-mercaptopropionate), trimethylolpropane tris (thioglycolate), pentaerythritol tetrakis (thioglycolate) and the most preferred pentaerythritol tetrakis ($\beta$-mercaptopropionate), dipentaerythritol hexa ($\beta$-mercaptopropionate), and trimethylolpropane tris ($\beta$-mercaptopropionate), and mixtures thereof. These compounds are commercially available. Certain polymeric polythiols such as polypropylene ether glycol bis ($\beta$-mercaptopropionate) which is prepared by esterification of polypropylene ether glycol may also be useful.

One example of an image-forming agent useful in the invention is a colorless electron donating compound. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV XI, and XX (Hilton-Davis Co.) are often used alone or in combination as color precursors in the present invention.

Illustrative examples of color developers useful in conjunction with the electron donating type color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5-di-tert-butyl salicylate (see U.S. Pat. Nos. 3,864,146 and 3,934,070, zinc 3,5-di($\alpha$-methylbenzyl) salicylate oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

Images can also be formed using as the image-forming agent, a chelating agent which reacts with a metal salt, as a developer, to generate a color image upon being released from the microcapsules. Some typical examples of useful image-forming pairs of this type are nickel nitrate and N,N' bis(2-octanoyloxethyl)-dithiooxamide, and alum [Fe(III)] and yellow prussiate.

Substantially any color-forming agent which can be encapsulated and which will react with a developer material to form an image can be used in the present invention. Furthermore, either the color former or the color developer may be associated with the microcapsules. It is not always necessary to encapsulate the color former, as is the conventional practice.

As a further alternative, the capsules may contain a visible dye or pigment. Substantially any benign colored dye, i.e., a dye which does not detrimentally attenuate the exposure radiation can be used in this embodiment. A few examples are Sudan Blue and Rhodamine B dyes. Certain pigments or toners can also be used.

The image-forming agent may be associated with the microcapsules in various ways such that upon release of the internal phase, the image-forming agent is able to react and/or migrate to produce an image. It is typically encapsulated with the photosensitive composition, in the microcapsules, however, it may also be incorporated in the walls of the microcapsules. Those skilled in the art will appreciate that various arrangements can be used provided that the activation or mobilization of the image-forming agent is controlled by rupturing the microcapsules and releasing the internal phase.

The internal phase may additionally include a diluent oil. Inclusion of the oil will often improve half tone gradation of visual images. Preferred diluent oils are weakly polar solvents having boiling points above 170° C. and preferably in the range of 180° to 300° C. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls and kerosense are generally less toxic and preferred. The amount of diluent oil incorporated in the microcapsules will depend upon the photographic characterstics that are desired in the photosensitive materials. Typically, the diluent oil is used in an amount of approximately 10 to 20% by weight based on the weight of the internal phase.

The photosensitive microcapsules of the present invention are easily formed using known encapsulation techniques. The photosensitive composition and associated agents can be encapsulated in hydrophilic wall-forming materials such as gelatin-type materials (see U.S. Pat. Nos. 2,730,456 and 2,800,457 to Green et al) including gum arabic, polyvinyl alcohol, carboxy-methyl-cellulose; resorcinol-formaldehyde wall formers (see U.S. Pat. No. 3,755,90 to Hart et al); isocyanate wall-formers (see U.S. Pat. No. 3,914,511 to Vassiliades); isocyanate-polyol wall formers (see U.S. Pat. No. 3,796,669 to Kirintani et al); urea formaldehyde wall-formers, particularly urea-resorcinolformaldehyde in which oleophilicity is enhanced by the addition of resorcinol (see U.S. Pat. Nos. 4,001,140; 4,087,376 and 4,089,802 to Foris et al); and melamineformaldehyde resin and hydroxypropyl cellulose (see commonly assigned U.S. Pat. No. 4,025,355 to Shackle).

The mean size of the microcapsules of the present invention generally ranges from approximately 1 to 25 microns. As a general rule, image resolution improves as capsule size decreases except that if the capsule size is too small, the capsules may disappear in the pore or fiber structure of some substrates.

The image-forming agent is used in an amount sufficient to produce a visible image of the desired density upon reaction with a developer or upon transfer. In general, the image-forming agent is present in an amount of approximately 0.5 to 25% by weight based on the weight of the photopolymerizable or photocrosslinkable species. A preferred range is about 2 to 10% by weight.

The most common substrate for the image-receiving sheet is paper. The paper may be a commercial impact raw stock, or a special grade paper such as cast-coated paper or chrome-rolled paper. Transparent substrates such as polyethylene terephthalate and translucent substrates can also be used in this invention.

Having described the invention in detail and by reference to specific embodiments thereof, it will be apparent that numerous modifications and variations are possible without departing from the spirit and scope of the following claims.

What is claimed is:

1. A method for forming images which comprises:
    depositing a uniform layer of photosensitive microcapsules on the surface of a support, said microcapsules being in the form of a free-flowing powder which is distributed upon said support but not permanently fixed thereto, said microcapsules comprising a discrete capsule wall containing a photosensitive composition and said microcapsules having associated therewith an image-forming agent,
    image-wise exposing said layer of photosensitive microcapsules to actinic radiation,
    subjecting said layer of microcapsules to a uniform rupturing force such that said microcapsules rupture and image-wise release said internal phase, and
    removing microcapsules from said support.

2. The method of claim 1 wherein said image-forming agent is a colored dye or pigment.

3. The method of claim 2 wherein said support is paper.

4. The method of claim 1 wherein said image-forming agent is one member of an image-forming pair of chromogenic materials which react to produce a visible image and said process further comprises reacting said one member with another member of said image-forming pair of chromogenic materials to produce an image.

5. The method of claim 4 wherein said image-forming agent is a substantially colorless color former.

6. A method for forming images which comprises:
    depositing a uniform layer of photosensitive microcapsules on the surface of a support, said microcapsules being in the form of a free-flowing powder which is distributed upon said support but not permanently fixed thereto, said microcapsules comprising a discrete capsule wall containing a photosensitive composition and said microcapsules having associated therewith a substantially colorless color-former, image-wise exposing said layer of photosensitive microcapsules to actinic radiation, subjecting said layer of microcapsules to a uniform rupturing force such that said microcapsules image-wise rupture and release said internal phase, reacting the color-former associated with said ruptured capsules with a developer material to produce a visible image, and removing microcapsules from said support.

7. The method of claim 6 wherein said color former is present in the internal phase of said microcapsules.

8. The method of claim 7 wherein said rupturing force is pressure.

9. The method of claim 8 wherein said support is a developer sheet, said sheet carrying a layer of a developer material which underlies said deposited microcapsules.

10. The method of claim 8 wherein said developer material is deposited on said support as a free-flowing powder prior to subjecting said microcapsules to said uniform rupturing force.

11. The method of claim 10 wherein said developer material is encapsulated in a photosensitive or a non-sensitive microcapsule.

12. The method of claim 10 wherein said support is plain paper.

13. A method for forming images which comprises:

depositing a uniform layer of photosensitive microcapsules on the surface of a support, said microcapsules being in the form of a free-flowing powder which is distributed upon said support but not permanently fixed thereto, said microcapsules comprising a discrete capsule wall containing a photosensitive composition and said microcapsules having associated therewith an image-forming agent, image-wise exposing said layer of photosensitive microcapsules to actinic radiation, contacting said support with an image-receiving sheet, subjecting said layer of microcapsules to a uniform rupturing force such that said microcapsules rupture and image-wise release said internal phase, and removing microcapsules from said support.

14. The method of claim 1 wherein said image-forming agent is a substantially colorless color former and said layer of microcapsules is subjected to said rupturing force in the presence of a developer material.

15. The method of claim 14 wherein said color former is present in the internal phase of said microcapsules.

16. The method of claim 15 wherein said support is electrostatically charged and said microcapsules are electrostatically attracted to said support.

17. The method of claim 15 wherein said uniform rupturing force is pressure.

18. The method of claim 13 wherein said photosensitive composition comprises an ethylenically unsaturated compound and a photoinitiator.

19. The method of claim 16 wherein said microcapsules have triboelectric properties.

20. The method of claim 10 wherein wherein said photosensitive composition comprises an ethylenically unsaturated compound and a photoinitiator.

* * * * *